United States Patent
Cheperak

(10) Patent No.: US 6,254,815 B1
(45) Date of Patent: Jul. 3, 2001

(54) MOLDED PACKAGING METHOD FOR A SENSING DIE HAVING A PRESSURE SENSING DIAPHRAGM

(75) Inventor: Michael Lan Cheperak, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/282,443

(22) Filed: Jul. 29, 1994

(51) Int. Cl.⁷ .............. B29C 45/14; B29C 70/70; B29C 70/72; B29C 70/74

(52) U.S. Cl. ............ 264/135; 264/272.15; 264/272.17

(58) Field of Search .............. 264/255, 271.1, 264/272.11, 272.15, 272.17, 272.13, 275, 294, 135

(56) References Cited

U.S. PATENT DOCUMENTS

| | | | |
|---|---|---|---|
| 3,706,840 | * 12/1972 | Moyle et al. | 264/272.17 |
| 4,686,764 | * 8/1987 | Adams et al. | 264/272.17 |
| 4,746,392 | * 5/1988 | Hoppe | 264/272.17 |
| 4,812,420 | * 3/1989 | Matsuda et al. | 264/272.11 |
| 4,822,536 | * 4/1989 | Voinis et al. | 264/272.17 |
| 4,823,605 | 4/1989 | Stein . | |
| 4,842,685 | * 6/1989 | Adams | 264/272.15 |
| 5,098,630 | * 3/1992 | Ogiu et al. | 264/272.15 |
| 5,102,828 | * 4/1992 | Marchisi | 437/211 |
| 5,105,820 | 4/1992 | Moriuchi et al. . | |

* cited by examiner

Primary Examiner—Angela Ortiz
(74) Attorney, Agent, or Firm—Anthony M. Martinez

(57) ABSTRACT

A method forms a plastic package (28) for a sensing die (10) having a pressure sensitive diaphragm (22), wherein the diaphragm (22) has a first surface (24) and a second surface (26) disposed opposite the first surface (24). According to this method, the sensing die (10) is mounted overlying a hole (18) in a die bond pad (16), which is used to support the sensing die (10) in the package (28). Next, the sensing die (10) is enclosed within a mold (12,14), and a molding material is introduced into the mold's interior to form the package (28) around the sensing die (10). During molding, the pressures on the first and second surfaces (24,26) of the diaphragm (22) are sufficiently equal to substantially prevent damage to the sensing die (10).

23 Claims, 2 Drawing Sheets

MOLDED PACKAGING METHOD FOR A SENSING DIE HAVING A PRESSURE SENSING DIAPHRAGM

BACKGROUND OF THE INVENTION

The present invention relates, in general, to pressure sensors and, more particularly, to a method of forming molded packages for sensing dies having a pressure sensing diaphragm.

Silicon sensing dies typically have a thin differential pressure-sensing membrane that is susceptible to mechanical damage during handling and packaging. For this reason, these sensing dies previously have been mounted in pre-molded packages and then sealed in the packages using a separate cover. Otherwise, if such a die were subjected to a conventional packaging process such as, for example, injection molding, the sensitive membrane of the die would be destroyed by the high pressures exerted on the membrane by the injected molding compound. Because pre-molded packages for mounting a sensing die typically have a plurality of leads protruding therefrom, they are bulky and difficult to handle in an automated assembly line.

Accordingly, there is a need for a method of packaging a sensing die having a sensitive membrane that avoids the use of a pre-molded package, and instead uses more conventional packaging techniques to form a package around the die without destroying the pressure sensing membrane.

DETAILED DESCRIPTION OF THE DRAWINGS

Briefly stated, the present invention provides a method of forming a package for a sensing die having a pressure sensing diaphragm. The diaphragm has a first surface and a second surface disposed opposite the first surface. According to this method, the sensing die is mounted overlying a hole in a die bond pad, which is used to support the sensing die in the package. Next, the sensing die is enclosed within a mold, and a molding material is introduced into the mold to form the package around the sensing die. During molding, the pressures on the first and second surfaces of the diaphragm are sufficiently equal to substantially prevent damage to the sensing die.

Figure 1:
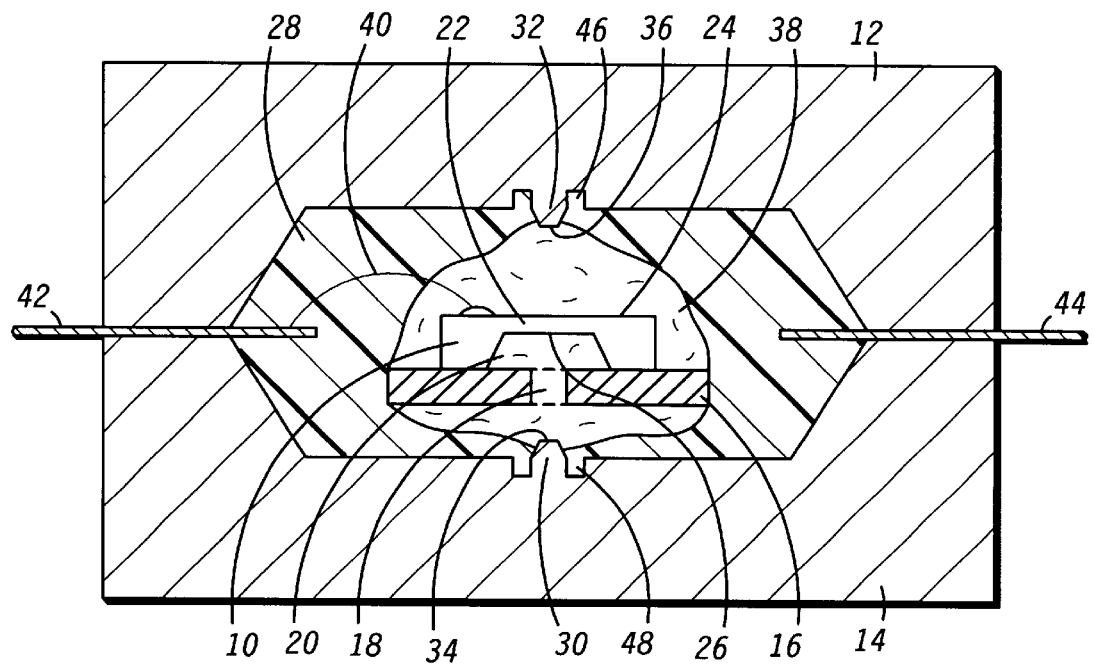
FIG. 1 is a cross-section illustrating the formation of a plastic package around a pressure sensing die according to the present invention.

The present invention can be more fully described with reference to FIGS. 1–3. FIG. 1 is a cross-section illustrating a pressure sensing die 10 enclosed by a top mold 12 and a bottom mold 14. Sensing die 10 is mounted on a die bond pad 16, for example, using a room-temperature vulcanized silicone. Die 10 can also be attached with a standard epoxy. Die bond pad 16 has a hole 18 which may have a variety of shapes such as circular or square as will be recognized by one of skill in the art from the description below. Pressure sensing die 10 is, for example, a silicon sensing die having a diaphragm 22. Diaphragm 22 has a first surface 24 and a second surface 26 disposed opposite first surface 24. Because diaphragm 22 is used, for example, as a differential pressure sensor, it has a relatively thin thickness of, for example, less than about 0.05 mm. Diaphragm 22 is typically a silicon diaphragm, but can be made of many thin materials.

According to the method of the present invention, a die coat 38 is used to coat sensing die 10 prior to molding. Specifically, die coat 38 preferably covers at least first surface 24 and second surface 26 of diaphragm 22. This is so that during molding the pressures on first surface 24 and second surface 26 are sufficiently equal to substantially prevent damage to sensing die 10. For example, the pressure difference between first surface 24 and second surface 26 is preferably less than about 100 KPa. One skilled in the art will also recognize that, in some cases, die coat 38 may cover more of sensing die 10 than just first surface 24 and second surface 26. As shown in FIG. 1, for example, die coat 38 substantially covers all of sensing die 10.

Top mold 12 has a pin 32, and die coat 38 touches top mold 12 at a contact surface 36. Bottom mold 14 has a pin 30, and die coat 38 touches bottom mold 14 at a contact surface 34. During molding, a plastic package 28 is formed by introducing molding material into the region enclosed by top mold 12 and bottom mold 14. According to the present invention, as the molding material is filling the region that will become plastic package 28, die coat 38 excludes the molding material from the regions around sensing die 10 that are covered by die coat 38. Molding material is also excluded from touching either top mold 12 or bottom mold 14 at contact surfaces 36 or 34 due to the presence of die coat 38. Because the molding material is excluded from contact surfaces 36 and 34, sensing holes will be formed in plastic package 28 where die coat 38 has excluded molding material at contact surfaces 36 and 34. Pin 32 is provided to form a port 46 for a sensing hole 80 (see FIG. 3). Pin 30 is provided to form a port 48 which also has a sensing hole (this hole is hidden and therefore not shown in FIG. 3).

A wire 40 connects sensing die 10 to a leadframe 42. Other wires (not shown) may also connect sensing die 10 to leadframe 42 or a leadframe 44. Here, for example, as is conventional, die bond pad 16 may be part of a composite leadframe (not shown) connected to portions of leadframes 42 and 44 disposed outside of molds 12 and 14. However, in general, die bond pad 16 may be any platform that will support sensing die 10, such as a plastic or ceramic base plate.

FIG. 1 is intended to illustrate a stage in the formation of plastic package 28 in which all elements shown in FIG. 1 are at a normal molding temperature of, for example, about 170° C. Die coat 38 will in general expand when heated and contract when cooled. Therefore, although FIG. 1 shows die coat 38 touching mold 12 at contact surface 36 and touching mold 14 at contact surface 34, when die coat 38 and the other elements in FIG. 1 are in a cooled state, die coat 38 may not be making physical contact at contact surfaces 36 or 34. For example, when molds 12 and 14 initially enclose sensing die 10, die coat 38 may be below a normal molding temperature. Thus, die coat 38 may not be making physical contact with contact surfaces 36 and 34. Such contact will occur as die coat 38 warms up to the molding temperature to be used. It is sufficient for the practice of the present invention that die coat 38 make this contact when heated to a normal molding temperature and prior to the introduction of the molding material.

During the injection molding process, die coat 38 contacts the molten molding material and prevents it's contact with diaphragm 22. As the molding process continues and a high pressure is produced on the molding material in order to fill the mold cavity, die coat 38 transfers pressure equally to either side of diaphragm 22, thus avoiding damage. Although a specific plastic package and extent of die coat coverage of sensing die 10 are shown here, one skilled in the art will recognize that the method of the present invention may be applied to a wide variety of packages using appropriately varying amounts and coverages of die coat 38. For example, it is not necessary that pins 30 or 32 be used to form ports 46 or 48. It is sufficient to form a sensing hole if die coat 38 touches a portion of top mold 12 or bottom mold 14 regardless of whether mold 12 or 14 has a flat, projecting, or other irregular shape.

A variety of materials may be used as die coat 38. In general, the material selected for use need only be capable of effectively transmitting the applied pressure to the sensing element and be compatible with the stress requirements of the sensor. Preferably, die coat 38 is formed of a material having a Young's modulus of about 2.0–4.0 MPa and having a coefficient of thermal expansion of about 150–300 ppm. However, it is not required that die coat 38 have these specific properties. As an example of a suitable material, die coat 38 may be a gel such as a silicone gel. One such gel is sold by Dow Corning under product number 6633. However, other materials substantially similar to this Dow Corning gel also may be used with the present invention. Room-temperature vulcanized silicone or other types of soft encapsulants and coatings are also suitable.

A variety of techniques may be used to apply die coat 38 to sensing die 10. In one approach, hole 18 is formed in die bond pad 16, and sensing die 10 is mounted thereon. Die coat 38 is then applied through hole 18 to substantially fill a chamber 20 underlying diaphragm 22. Die coat 38 is also applied overlying first surface 24 of diaphragm 22. In some cases, for example, diaphragm 22 must be free to bend in either direction. In these cases, die coat 38 is applied to both sides of diaphragm 22 in sufficient quantity so that the hardened mold compound forming plastic package 28 does not touch the diaphragm to impede this bending.

One skilled in the art will recognize that many types of package molding procedures can be applied to the present invention. However, in a preferred approach, plastic package 28 is formed by injection molding.

Figure 2:
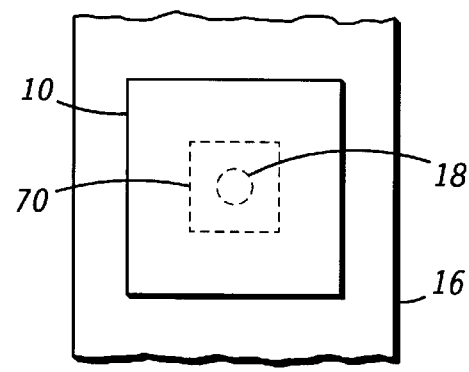
FIG. 2 is a top view of a pressure sensing die mounted on a die bond pad.

FIG. 2 is a top view of pressure sensing die 10 mounted on die bond pad 16. Diaphragm perimeter 70 substantially corresponds to the edge of the thin region of diaphragm 22 of FIG. 1. Preferably, sensing die 10 is positioned overlying die bond pad 16 and hole 18 so that hole 18 is disposed substantially within the boundary defined by diaphragm perimeter 70 in FIG. 2.

Figure 3:
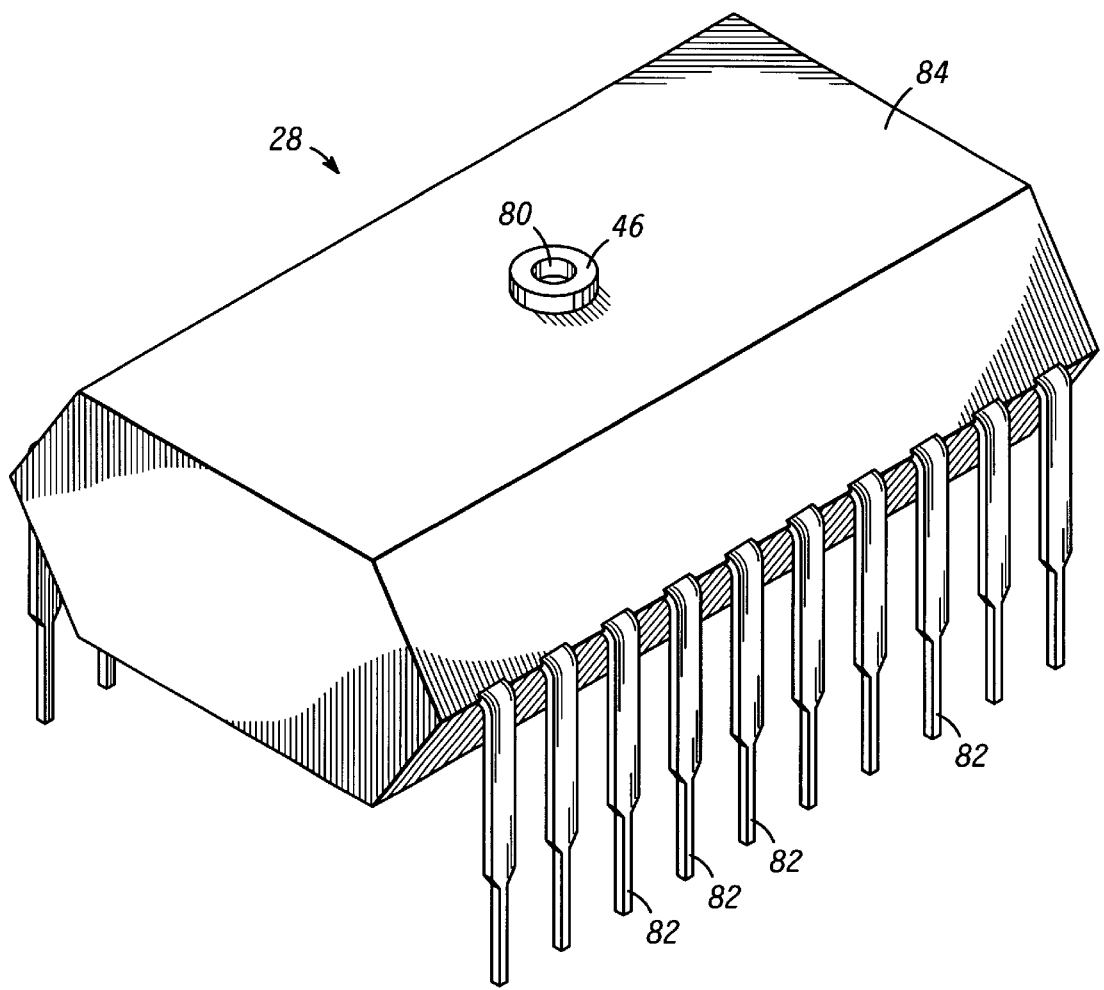
FIG. 3 is a perspective view of a plastic package having a port with a sensing hole according to the present invention.

FIG. 3 is a perspective view of plastic package 28. Port 46 is disposed on a top surface 84 and has sensing hole 80 for connecting an outside world medium having its pressure sensed to the interior of package 28. A plurality of leads 82 are connected to leadframes 42 and 44 (see FIG. 1).

In an alternate approach to the present invention, die coat 38 may be removed after molding plastic package 28. Because die coat 38 has been applied to equalize pressures on diaphragm 22 to avoid its destruction, one skilled in the art will recognize that die coat 38 may be substantially removed following the formation of plastic package 28. For example, a chemical appropriate to the material selected for die coat 38 may be introduced through sensing hole 80 for dissolving and removing die coat 38 from plastic package 28.

Also, in an alternative embodiment of the present invention, die coat 38 does not need to be used at all. Instead, during molding, the molding material may be permitted to pass through hole 18 into chamber 20 so that pressures are substantially equalized on first and second surfaces 24 and 26 during molding. Although sensing holes will not be provided in this alternative embodiment, pressure sensing die 10 may still be useful for certain high pressure applications. In addition, one skilled in the art will recognize that sensing hole 80 may be temporarily sealed by a cap or plug to avoid contamination of the interior of plastic package 28 during, for example, plating of leads 82.

By now it should be appreciated that there has been provided a novel method of forming a molded package for a sensing die having a pressure sensing diaphragm. By the use of the present invention, several problems of the prior art are avoided. One advantage of the present invention is that it avoids the need to use pre-molded packages. This can greatly reduce manufacturing costs and time, and also permit a wide variety of package configurations.

Another advantage is that standard packaging assembly lines can be readily adapted to use the present invention. It is desirable to use an injection molding system and standard, reliable semiconductor grade plastics. The present invention permits this. Typically, there exists thousands of reliability hours of data on injection molded plastics, as well as extensive process data on the corresponding molding technique. The present invention allows this reliability and process data to be used to advantage in packaging a pressure sensing die.

What is claimed is:

1. A method of forming a package for a sensing die having a pressure sensing diaphragm, said diaphragm having a first surface and a second surface disposed opposite said first surface, comprising the steps of:

mounting said sensing die overlying a hole of a die bond pad;

enclosing said sensing die within a mold; and introducing a molding material into said mold to form said package.

2. The method of claim 1 wherein a first pressure on said first surface of said diaphragm and a second pressure on said second surface of said diaphragm are sufficiently equal during said step of introducing a molding material to substantially prevent damage to said sensing die.

3. The method of claim 1 further comprising the step of coating a portion of said sensing die with a die coat.

4. The method of claim 3 wherein said die coat covers said first surface of said diaphragm and said second surface of said diaphragm.

5. The method of claim 3 wherein said step of coating comprises passing said die coat through said hole of said die bond pad to contact said second surface of said diaphragm.

6. The method of claim 3 wherein a first portion of said die coat touches a contact surface of said mold during said step of introducing a molding material to form at least one sensing hole in said package.

7. The method of claim 6 wherein:

said mold has a top part and a bottom part;

said first portion of said die coat touches said top part of said mold to form a first sensing hole in said package; and a second portion of said die coat touches said bottom part of said mold to form a second sensing hole in said package.

8. The method of claim 7 wherein:

said die bond pad is connected to a lead frame; and said lead frame comprises a plurality of leads radiating out in a direction away from said die bond pad.

9. The method of claim 8 wherein:

said package is plastic; and said step of introducing a molding material comprises injection molding.

10. The method of claim 3 wherein said die coat substantially covers all of said diaphragm.

11. The method of claim 3 wherein said die coat is a gel.

12. The method of claim 3 wherein said die coat is a material substantially similar to silicone gel.

13. The method of claim 3 wherein said die coat comprises silicone gel.

14. The method of claim 3 wherein said die coat is a material having a Young's modulus between about 2.0 and 4.0 MPa and having a coefficient of thermal expansion between about 150 and 300 ppm.

15. The method of claim 3 further comprising the step of substantially removing said die coat following said step of introducing a molding material.

16. The method of claim 1 wherein, during said step of introducing a molding material, said molding material passes through said hole of said die bond pad and contacts said second surface of said diaphragm.

17. A method of forming a package for a sensing die supported in said package by a die bond pad, said sensing die having a pressure sensing diaphragm, and said diaphragm having a first surface and a second surface disposed opposite said first surface, comprising the steps of:

mounting said sensing die overlying a hole of said die bond pad wherein said second surface of said diaphragm faces said hole;

coating said sensing die with a die coat wherein said die coat covers at least said first surface of said diaphragm and at least said second surface of said diaphragm;

enclosing said sensing die within a mold; and forming said package by introducing a molding material into said mold wherein said die coat contacts a first portion of said mold to substantially exclude said molding material so that a first sensing hole is formed in said package.

18. The method of claim 17 wherein a chamber is disposed between said second surface of said diaphragm and said die bond pad.

19. The method of claim 18 wherein said die coat fills said chamber to cover said second surface of said diaphragm.

20. The method of claim 19 wherein said package comprises a first port disposed around said first sensing hole.

21. The method of claim 20 further comprising the step of capping said first port.

22. The method of claim 17 wherein said hole of said die bond pad is disposed substantially within a perimeter of said diaphragm.

23. The method of claim 17 wherein, during said step of forming said package, said die coat contacts a second portion of said mold so that a second sensing hole is formed in said package.

* * * * *

UNITED STATES PATENT AND TRADEMARK OFFICE
CERTIFICATE OF CORRECTION

PATENT NO. : 6,254,815 B1
DATED : July 3, 2001
INVENTOR(S) : Michael Alan Cheperak It is certified that error appears in the above-identified patent and that said Letters Patent is hereby corrected as shown below:

<u>Title page,</u>
Item [75], should read:
-- [75]  Inventor:  Michael Alan Cheperak, Tempe, AZ (US) --

Signed and Sealed this

Thirtieth Day of December, 2003

JAMES E. ROGAN
*Director of the United States Patent and Trademark Office*